(12) United States Patent
Chang-Hasnain et al.

(10) Patent No.: US 11,881,683 B2
(45) Date of Patent: Jan. 23, 2024

(54) EPITAXIAL GROWTH ON A GALLIUM ARSENIDE PHOSPHIDE CAPPED MATERIAL ON A GALLIUM ARSENIDE SUBSTRATE

(71) Applicant: THE REGENTS OF THE UNIVERSITY OF CALIFORNIA, Oakland, CA (US)

(72) Inventors: Constance J. Chang-Hasnain, Palo Alto, CA (US); Jiaxing Wang, Albany, CA (US); Jonas H. Kapraun, Albany, CA (US); Emil Kolev, Pacifica, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 558 days.

(21) Appl. No.: 17/090,846

(22) Filed: Nov. 5, 2020

(65) Prior Publication Data
US 2021/0159669 A1    May 27, 2021

Related U.S. Application Data

(63) Continuation of application No. PCT/US2019/031691, filed on May 10, 2019.
(Continued)

(51) Int. Cl.
*H01S 5/183* (2006.01)
*H01S 5/30* (2006.01)
*H01L 21/02* (2006.01)

(52) U.S. Cl.
CPC .... *H01S 5/18361* (2013.01); *H01L 21/02395* (2013.01); *H01L 21/02461* (2013.01);
(Continued)

(58) Field of Classification Search
CPC .......... H01L 21/0262; H01L 21/324; H01L 21/02461; H01L 33/105;
(Continued)

(56) References Cited

U.S. PATENT DOCUMENTS 4,731,791 A * 3/1988 Wilson ............... H01S 5/227
372/46.012
5,872,022 A * 2/1999 Motoda ............... H01L 21/0262
257/E21.123

(Continued)

FOREIGN PATENT DOCUMENTS

CN    103548220 A    1/2014
CN    104011840 A    8/2014
(Continued)

OTHER PUBLICATIONS

ISA/KR, Korean Intellectual Property Office (KIPO), International Search Report and Written Opinion dated Aug. 26, 2019, related PCT international application No. PCT/US2019/031691, pp. 1-10, claims searched, pp. 11-17.
(Continued)

*Primary Examiner* — Eric A. Ward
*Assistant Examiner* — Zachary Taylor Nix
(74) *Attorney, Agent, or Firm* — O'BANION & RITCHEY LLP; John P. O'Banion (57) ABSTRACT

A semiconductor device fabrication method in which a growing process is followed by a capping process in which a phosphor containing material cap layer is deposited over a final GaAs based layer. The wafer, containing many such substrates, can be removed from the reaction chamber to continue processing at a later time without creating an oxide layer on the final GaAs based layer. In continuing processing, a decomposition process selectively decomposes the phosphor containing material cap layer, after which a
(Continued)

regrowing process is performed to grow additional layers of the device structure. The capping, decomposition and regrowth processes can be repeated multiple times on the semiconductor devices on the wafer during device fabrication.

32 Claims, 4 Drawing Sheets

Related U.S. Application Data

(60) Provisional application No. 62/670,082, filed on May 11, 2018.

(52) U.S. Cl.
CPC .. *H01L 21/02463* (2013.01); *H01L 21/02543* (2013.01); *H01L 21/02546* (2013.01); *H01S 5/3013* (2013.01); *H01S 5/18311* (2013.01); *H01S 2304/02* (2013.01); *H01S 2304/04* (2013.01)

(58) Field of Classification Search
CPC ....... H01L 21/30612–30621; H01S 5/00–509; H01S 5/423; H01S 5/183; G02F 1/3135
See application file for complete search history.

(56) References Cited

U.S. PATENT DOCUMENTS

| | | | |
|---|---|---|---|
| 6,642,070 | B2 | 11/2003 | Jiang |
| 2003/0091083 | A1 | 5/2003 | Hwang |
| 2004/0144984 | A1 | 7/2004 | Knigge |
| 2009/0213892 | A1 | 8/2009 | Onishi |
| 2009/0286342 | A1 | 11/2009 | Takahashi |
| 2012/0236892 | A1* | 9/2012 | Johnson ............... B82Y 20/00 372/45.01 |
| 2017/0141538 | A1* | 5/2017 | Uchida ............... H01S 5/18366 |
| 2017/0149212 | A1* | 5/2017 | Uchida ............... G01B 9/02004 |
| 2018/0034242 | A1 | 2/2018 | Mathai |

FOREIGN PATENT DOCUMENTS

| | | |
|---|---|---|
| CN | 104335365 A | 2/2015 |
| JP | 2000223792 A | 8/2000 |
| JP | 2007219561 A | 8/2007 |
| WO | 2019217798 A1 | 11/2019 |

OTHER PUBLICATIONS

State Intellectual Property Office of the People's Republic of China, The First Office Action dated Oct. 7, 2023, related Chinese patent application No. 201980030071.7, Chinese-language document, pp. 1-12, English-language translaton, 13-24, with claims examined, pp. 25-31.

* cited by examiner

EPITAXIAL GROWTH ON A GALLIUM ARSENIDE PHOSPHIDE CAPPED MATERIAL ON A GALLIUM ARSENIDE SUBSTRATE

CROSS-REFERENCE TO RELATED APPLICATIONS

This application claims priority to, and is a 35 U.S.C. § 111(a) continuation of, PCT international application number PCT/US2019/031691 filed on May 10, 2019, incorporated herein by reference in its entirety, which claims priority to, and the benefit of, U.S. provisional patent application Ser. No. 62/670,082 filed on May 11, 2018, incorporated herein by reference in its entirety. Priority is claimed to each of the foregoing applications.

The above-referenced PCT international application was published as PCT International Publication No. WO 2019/217798 A1, which publication is incorporated herein by reference in its entirety.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to semiconductor light emitters, and more particularly to epitaxial growth in the fabrication of vertical cavity surface emitting devices and other integrated optoelectronic devices.

2. Background Discussion

Vertical cavity surface emitting lasers (VCSELs) have applications in various areas, including telecommunications, sensing and printing. In recent years, high contrast grating VCSELs (HCG-VCSELs) have attracted significant interests among researchers. Compared to conventional VCSELs which use two DBRs as top and bottom reflectors, HCG-VCSEL wafers provide more tolerant epitaxy requirements with the replacement of the top DBR mirror by a HCG mirror. In addition, the HCG mirror provides polarization and transverse mode control in the VCSEL. By integrating a micro-electromechanical structure (MEMS) with the HCG mirror, the laser wavelength can be tuned continuously by changing cavity length. These MEMS-VCSELs are enabling new applications in 3D sensing, optical coherent tomography (OCT) and light detection and ranging (LIDAR) systems.

Compared to a conventional top DBR which is usually 3 µm thick, the HCG reflector is a thin layer of around several hundred nanometers thickness. Thus, for the HCG-VCSEL, the bottom DBR mirror is the thickest structure in the entire epitaxial growth. For a VCSEL emitting in the wavelength regime of about 920 to 1100 nm, typically InGaAs/GaAsP strain compensated quantum wells are used as the active region, while the bottom DBR contains AlAs or AlGaAs with high Al composition.

Given the two materials require different growth temperatures and reactor conditions, a single continuous growth presents significant challenges and can compromise growth precision. In addition, it can be an inefficient process when only part of the layers do not meet requirements.

Accordingly, the presented technology overcomes the need for continuous fabrication processes, and provides additional benefits.

BRIEF SUMMARY

A high precision semiconductor fabrication regrowth method is described for GaAs based devices and has been tested in fabricating a vertical cavity surface emitting laser (VCSEL). It should be appreciated the method can be utilized for fabricating other optoelectronic devices, or even other semiconductor devices, such as that utilize a GaAs based substrate and layers. The disclosure provides an ability to regrow a HCG-VCSEL, or other optoelectronic device, on a pre-qualified GaAs/AlGaAs DBR substrate toward reducing engineering and development time while enabling higher wafer throughput. Moreover, it will be appreciated that most innovations occur in the active region, just above or below the active region, or in the HCG reflector, while the DBR substrate is a repeated structure in every run. Thus, the ability to grow many DBR substrates in one fully loaded reactor and consecutively regrow on the DBR substrate in a lower quantity basis can significantly reduce costs and shorten the innovation cycle.

The regrowth interface is very critical to get good regrowth quality. Acids are used to remove native oxide on the GaAs surface, but also leave residues and contaminations that are produced as byproducts of the etching process. Those impurities can persist under high-temperature treatment during the epitaxial growth and cause defects or dislocations in the regrown layers.

Accordingly, one goal of the presented technology is to provide a new growth method for vertical cavity surface emitting lasers, and other photonic devices, and semiconductor devices using GaAs based materials. Another goal is to reduce device development costs while accelerating the innovation cycle. Still another goal is the realization of regrowth while providing high levels of crystal quality. A further goal is to separate different growth steps in different reactors to avoid cross-contamination.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only.

DETAILED DESCRIPTION

Due to the complexity of epitaxial layers, and the high level of precision and thickness control required for those layers in VCSELs and many integrated photonic (photoelectrical) devices, one-step epitaxial growth typically leads to low wafer yield. A calibration error in the early part of the epitaxy may render the entire wafer useless. Attempts at growth interruption have been tried over the last decades; however, this has lead inevitably to poor optoelectronic properties of the second growth. By using the new technology described in this disclosure, the growth time can be shortened significantly, thus accelerating the innovation cycle.

One embodiment of the presented technology is a GaAsP capping layer (phosphor containing material cap layer), which can be incorporated on a first GaAs- and AlGaAs-based compound as a growth interruption layer. The wafer can be taken out of the vacuum or protective atmosphere inside the growth chamber and can be measured at room temperature and ambient conditions for its various properties to insure wafer quality. It should be noted that despite the lattice mismatch of GaAsP layer with GaAs/AlGaAs epitaxy, the wafers can be stored for a long period of time in air without compromising of the material quality and integrity. Subsequently, for the second growth, the GaAsP-capped wafer can be loaded back into a reactor and using the novel desorption technique described in this disclosure to start a regrowth process on the wafer subsequent to the first growth. Using the disclosed method the second epitaxial growth was found to exhibit excellent material quality. The present disclosure demonstrates this by fabricating a VCSEL device using this method, with the results showing excellent laser performance while requiring only about two hours of epitaxial regrowth.

An epitaxial regrowth method is described which is based on in-situ desorption. In one embodiment, a GaAsP capping layer (or other phosphor containing material cap layer) is intentionally deposited on the DBR in a first growth. This cap layer also protects the DBR wafer from forming native oxide while exposed to atmospheric conditions. In a second growth, this capping layer is selectively decomposed and then the remaining layers of the device (e.g., VCSEL) are grown on the fresh surface. Excellent regrowth quality is reached with this regrowth method.

In the first growth, a bottom distributed Bragg reflector (DBR) mirror stack with a first type of doping is first grown epitaxially on a semiconductor substrate having the same type doping. After this a thin (e.g., approximately 5 to 100 nm) capping layer is deposited on top of the DBR. The first growth finishes at this point and the wafer is removed from the chamber.

Then, such as at a later time, the DBR is loaded into a reactor again for regrowing. The second growth starts with high temperature desorption (e.g., at about 500 to 900 degrees C.) under Tertiarybutylarsine (TBAs) or $AsH_3$ flow for sufficient time to desorb the capping layer. Because there are no group V phosphors in the reactor, the phosphor containing material cap layer (e.g., GaAsP) is not stable and will decompose and evaporate. However, the semiconductor material (e.g., GaAs based semiconductor material) below the GaAsP is stable in an As atmosphere, thus the cap layer is selectively evaporated while not impacting the lower GaAs based layers.

In at least one embodiment, after GaAsP decomposition a contact layer is formed with the same type of doping as the DBR is grown, followed by an undoped active region as gain material. Another contact layer with different doping from the first contact layer is grown on the active region. After this second contact layer, an upper reflector is fabricated, such as layers of a DBR, or an HCG based reflector by growing an HCG sacrificial layer and HCG layer.

Although the HCG is used as top reflector in this embodiment, the technology is also suitable for fabricating VCSEL devices that utilize DBRs as top or bottom mirrors, or both top and bottom mirrors. The growth method can be performed with any suitable process, such as molecular beam epitaxy (MBE) or metal-organic chemical vapor deposition (MOCVD).

Furthermore, Instead of GaAsP on GaAs, any phosphor containing material that can be selectively decomposed from the GaAs can be used, such as binary GaP, Ternary InGaP, AlGaP, InAlP, AlAsP and quaternary InGaAsP, InAlAsP.

Also, the regrowth time is not limited to two times growth. The wafer can be capped with GaAsP again in the second growth, and then do a decomposition at the third growth, and so forth.

EXAMPLE 1

Figure 1:
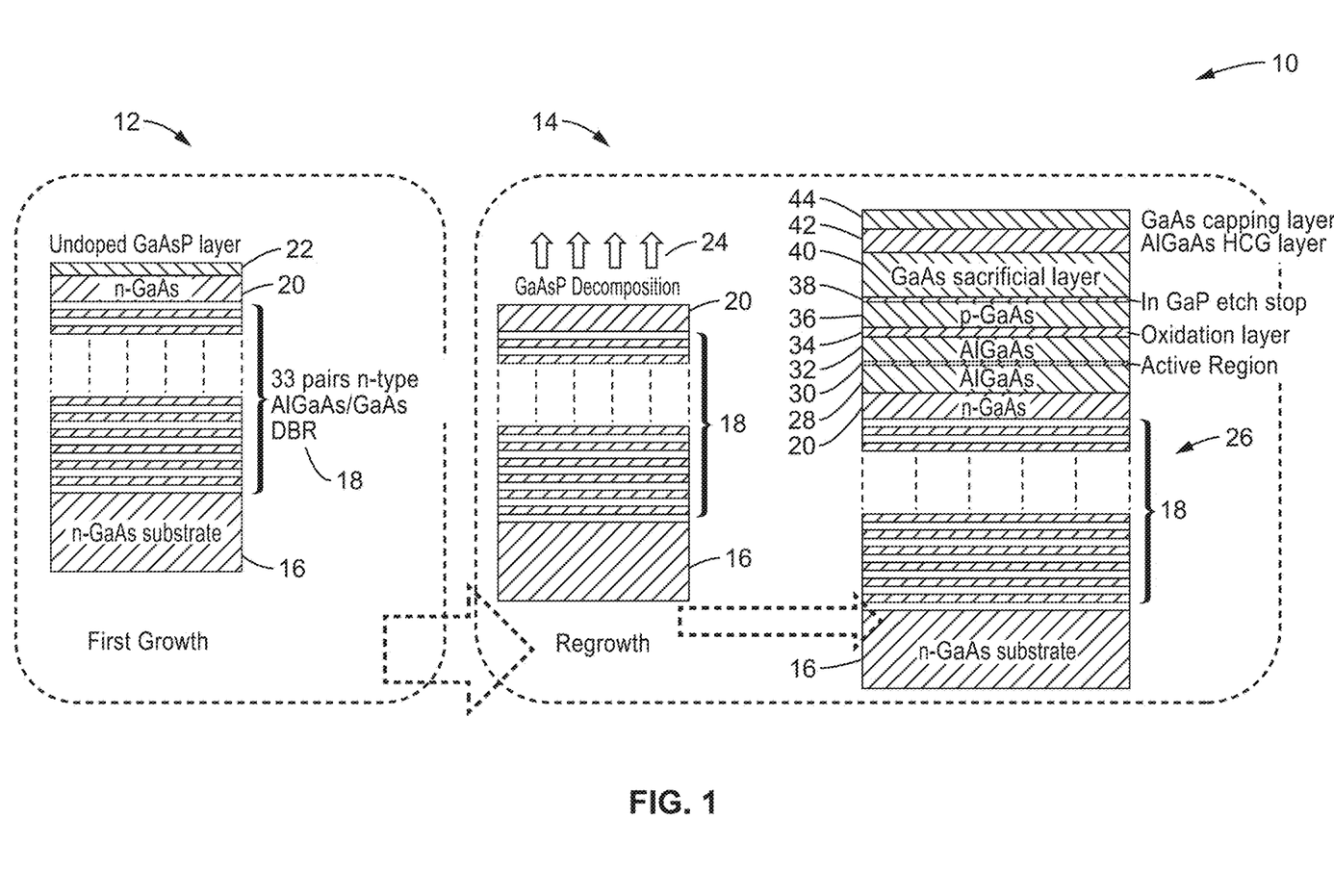
FIG. 1 is a schematic of a regrowing procedure according to an embodiment of the present disclosure.

FIG. 1 illustrates an example embodiment 10 of the process of performing the first growth 12 and regrowth 14. In the first growth, a first part of a semiconductor structure is grown, herein exemplified as a DBR stack 18 which is depicted by way of example with 33 pairs n-type doped Al0.9Ga0.1As/GaAs is grown, such as using MOCVD upon a n-GaAs substrate. Layer 20 is a GaAs phase matched spacer layer. The epitaxial growth ends with an undoped phosphor containing material cap layer (e.g., GaAsP) 22, such as having a thickness of 20 nm. Then the wafer is removed from the reaction chamber.

In the second growth 14, the DBR wafer described above is loaded into a different MOCVD reactor, again without any pretreatment for regrowth. The regrowth starts with GaAsP decomposition 24, for example at about 700 degrees Celsius under a TBAs flow for a sufficient period of time to decompose the GaAsP, such as about 20 minutes. After decomposition, the remaining n-GaAs 28, 32, active region 30, p-Al0.98Ga0.02As oxidation layer 34, p-GaAs 36, InGaP etch stop 38, GaAs sacrificial layer 40, Al0.6Ga0.4As HCG layer 42 and GaAs capping layer 44 are grown.

Figure 2A:
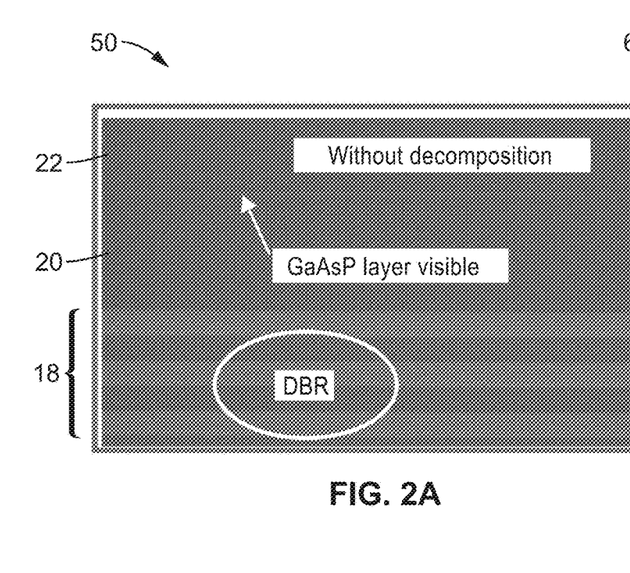
FIG. 2A and FIG. 2B are scanning electron microscope (SEM) images of GaAsP capping shown without and with decomposition, respectively, according to an embodiment of the present disclosure.
Figure 2B:
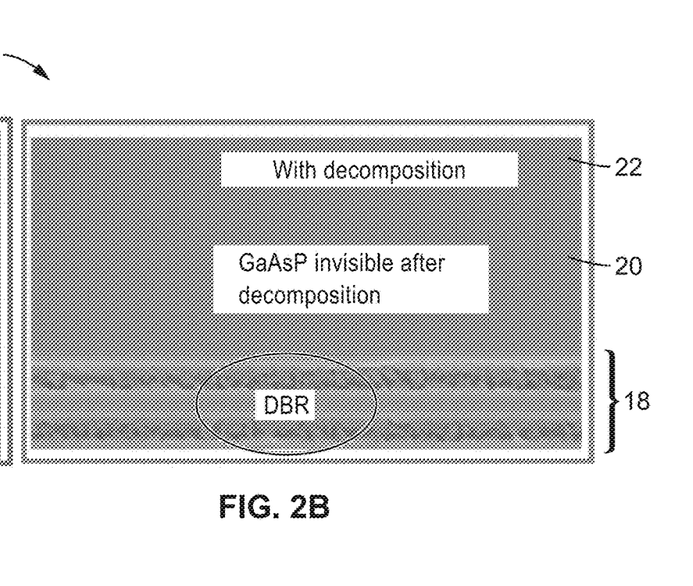

FIG. 2A and FIG. 2B illustrate scanning electron microscope (SEM) images 50, 60 showing the structure prior to decomposition in FIG. 2A, and after decomposition in FIG. 2B. FIG. 2A depicts the DBR 18 upon which is the GaAs layer 20 over which is a GaAsP capping layer 22. A line is visible in the SEM image of FIG. 2A between the GaAs and GaAsP layers. In FIG. 2B the decomposition has been performed, and there is no line seen between the GaAs layer and decomposed GaAsP layer, thus the figures illustrate that the GaAsP has been cleanly decomposed.

Figure 3:
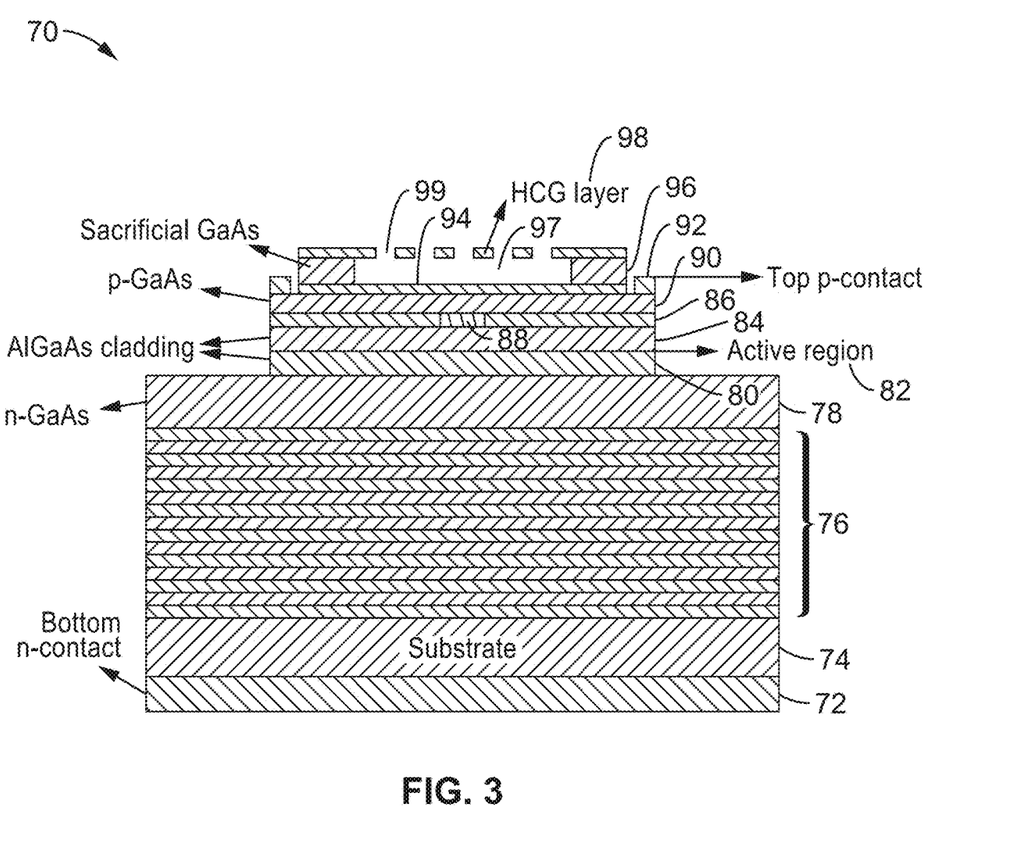
FIG. 3 is a schematic of a vertical cavity surface emitting laser (VCSEL) device fabricated according to an embodiment of the present disclosure.

FIG. 3 illustrates an example embodiment 70 of a VCSEL device fabricated according to the disclosed process. After regrowth, the wafer is fabricated into a device. The figure depicts a substrate 74 with bottom n-contact 72. A DBR 76 is over the substrate, followed by n-GaAs layer 78. Then in a first mesa an active region 82 is seen within AlGaAs cladding layers 80, 84, followed by an oxidation layer 86, with aperture 88, over which is p-GaAs layer 90, and top p-contact 92. A second mesa is shown with the etch stop layer 94, sacrificial GaAs 96, a portion of which is removed to form air cavity 97, and an HCG layer 98 with grating elements 99.

In this example embodiment, the fabrication included a wet chemical etch to form the mesas, Ti/Au evaporation to form top p-contact and backside n-contact, wet oxidation to form the aperture, ebeam lithography and RIE etch to define the HCG, selective etch to form the air cavity under the HCG. It will be appreciated that different techniques can be applied, insofar as the capping and desorption processes are performed.

Figure 4A:
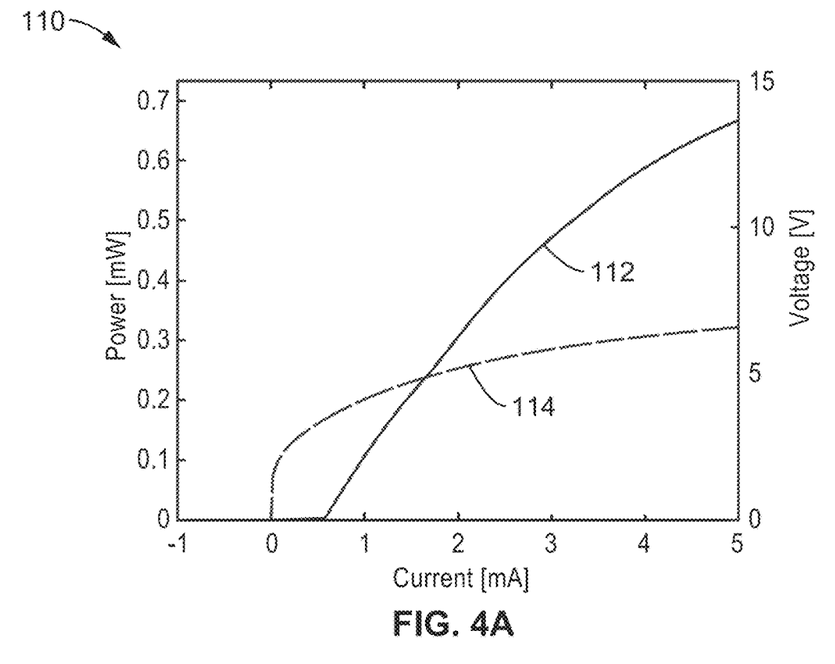
FIG. 4A and FIG. 4B are plots of a light-current-voltage (LIV) curve and spectrum plot for the device of FIG. 3 fabricated according to an embodiment of the present disclosure.
Figure 4B:
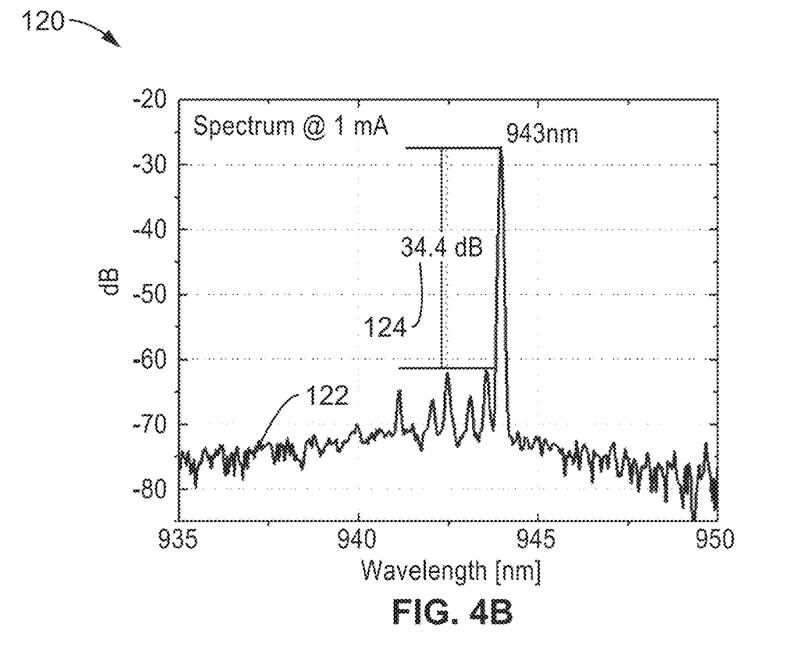

FIG. 4A and FIG. 4B illustrate test results 110, 120 for an example VCSEL embodiment. In FIG. 4A is depicted a light-current-voltage (LIV) curve showing a power curve 112, and a voltage curve 114. In FIG. 4B is shown a spectrum for device showing an off resonant operation 122 with a resonant peak which is 34.4 dB above 124 the non resonant intensity.

It is thus seen that the resultant device from using this regrowth technique shows excellent performance. The present disclosure successfully demonstrates a single-mode room-temperature continuous-wave laser with 600 µA threshold using the presented technology.

The disclosed vertical cavity surface emitting laser epitaxial regrowth method on a GaAsP-capped distributed Bragg reflector provides excellent laser performance which has been achieved employing only two hours of epitaxial regrowth.

Compared to prior techniques, the presented technology is expected to provide the following benefits, among others: (a) cost savings on epitaxial materials; (b) short growth time enabling faster innovation cycles; (c) use of direct in-situ surface treatments which can avoid residues and contaminations; and (d) the ability to separate growth steps with different or conflicting materials into multiple growth steps in different reactors to avoid cross-contamination.

From the description herein, it will be appreciated that the present disclosure encompasses multiple embodiments which include, but are not limited to, the following:

1. A method of fabricating GaAs based semiconductor device structures, comprising: (a) performing a growing process in a reaction chamber by growing elements of a semiconductor device structure with a first type of doping over a semiconductor substrate having the first type of doping and ending with growing a final GaAs based layer of the device; (b) performing a capping process by depositing a phosphor containing material cap layer over the final GaAs based layer formed during the growing process, wherein said phosphor containing material cap layer protects elements of the semiconductor device structure from oxidizing when exposed to atmospheric conditions; (c) performing a decomposition process by selectively decomposing the phosphor containing material cap layer by using high temperature desorption; and (d) performing a regrowing process in which other layers of the GaAs based semiconductor device structure are grown.

2. A method of fabricating semiconductor optoelectronic device structures, comprising: (a) performing a growing process in a reaction chamber by growing a distributed Bragg reflector (DBR) stack with a first type of doping over a semiconductor substrate also having the first type of doping, and ending with growing a final GaAs based layer; (b) performing a capping process by depositing a phosphor containing material cap layer over the distributed Bragg reflector (DBR), wherein said phosphor containing material cap layer protects the DBR from forming oxide while exposed to atmospheric conditions; (c) performing a decomposition process by selectively decomposing the phosphor containing material cap layer by using high temperature desorption; and (d) performing a regrowing process in which other layers of a semiconductor optoelectronic device are fabricated.

3. A method of fabricating a vertical cavity surface emitting laser (VCSEL), comprising: (a) performing a growing process in a reaction chamber by growing a distributed Bragg reflector (DBR) stack with a first type of doping over a semiconductor substrate also having the first type of doping, and ending with growing a final GaAs layer; (b) performing a capping process by depositing a phosphor containing material cap layer over the distributed Bragg reflector (DBR), wherein said phosphor containing material cap layer protects the DBR from forming oxides while exposed to atmospheric conditions; (c) performing a decomposition process by selectively decomposing the phosphor containing material cap layer by using high temperature desorption; (d) performing a regrowing process in which other layers of a vertical cavity surface emitting laser (VCSEL) are fabricated, comprising: (d)(i) growing a first contact layer with the same type of doping as the DBR; (d)(ii) growing an undoped active region as gain material; (d)(iii) growing a second contact layer on the active region with different doping from the first contact layer; and (d)(iv) growing layers of an upper reflector.

4. A method for high-quality epitaxial regrowth of optoelectronic devices based on multiple growths.

5. The apparatus or method of any preceding embodiment, further comprising forming a contact layer over the final GaAs based layer after the decomposition process and prior to fabricating additional layers of the semiconductor device structure.

6. The apparatus or method of any preceding embodiment, wherein said semiconductor substrate is contained on a semiconductor wafer upon which semiconductor devices are being fabricated.

7. The apparatus or method of any preceding embodiment, wherein growing of elements of the semiconductor device structures are performed by either molecular beam epitaxy (MBE) or metal-organic chemical vapor deposition (MOCVD).

8. The apparatus or method of any preceding embodiment, wherein said phosphor containing material cap layer comprises a layer selected from a group of phosphor containing materials consisting of: binary GaP, Ternary InGaP, AlGaP, InAlP, AlAsP and quaternary InGaAsP, InAlAsP.

9. The apparatus or method of any preceding embodiment, wherein said phosphor containing material cap layer comprises a layer which is from approximately 5 to 100 nm thick.

10. The apparatus or method of any preceding embodiment, wherein said high temperature desorption of said phosphor containing material cap layer is performed at a temperature of from approximately 500 to 900 degrees Celsius.

11. The apparatus or method of any preceding embodiment, wherein said high temperature desorption of said phosphor containing material cap layer is performed under a flow of Tertiarybutylarsine (TBAs) or AsH$_3$.

12. The apparatus or method of any preceding embodiment, wherein desorption of said phosphor containing material cap layer occurs in response to a lack of group V phosphors in the reaction chamber, causing instability in said phosphor containing material cap layer which leads to decomposition and evaporation.

13. The apparatus or method of any preceding embodiment, wherein said semiconductor layers beneath said phosphor containing material cap layer remain stable and are not decomposed.

14. The apparatus or method of any preceding embodiment, wherein said semiconductor substrate, upon which are the growing elements of a semiconductor device structure, is removed from the reaction chamber between the capping process and the decomposition process.

15. The apparatus or method of any preceding embodiment, wherein said capping process, decomposition process and regrowth process can be repeated multiple times on said semiconductor substrate during semiconductor device fabrication.

16. The apparatus or method of any preceding embodiment, wherein GaAs based layers beneath said phosphor containing material cap layer remain stable and are not decomposed.

17. The apparatus or method of any preceding embodiment, wherein said upper reflector comprises either a distributed Bragg reflector (DBR) or a high-contrast grating (HCG).

18. The apparatus or method of any preceding embodiment, wherein said semiconductor substrate is contained on a semiconductor wafer upon which vertical cavity surface emitting laser (VCSEL) devices are being fabricated.

19. The apparatus or method of any preceding embodiment, wherein the multiple regrowth comprises: a first growth and a second growth (regrowth), with the wafer taken out of the chamber between first growth and regrowth, and the wafer is also taken out of the chamber between different regrowths.

20. The apparatus or method of any preceding embodiment, wherein the first growth ends with a GaAsP cap layer.

21. The apparatus or method of any preceding embodiment, wherein the regrowth starts with GaAsP cap layer decomposition. After this layer is evaporated, the remaining layers are grown in the second growth.

22. The apparatus or method of any preceding embodiment, wherein the capping layer can be any layers that can be selectively decomposed from the substrate.

23. The apparatus or method of any preceding embodiment, wherein the regrowth can be repeated multiple times.

24. An apparatus, structure, device, device structure, or construct fabricated according to the method of any preceding embodiment.

Embodiments of the present technology may be described herein with reference to flowchart illustrations of methods and systems according to embodiments of the technology and method steps.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method of fabricating GaAs based semiconductor device structures, comprising:
   (a) performing a growing process in a reaction chamber by growing elements of a semiconductor device structure with a first type of doping over a semiconductor substrate having the first type of doping and ending with growing a final GaAs based layer of the device;
   (b) performing a capping process by depositing a phosphor containing material cap layer over the final GaAs based layer formed during the growing process, wherein said phosphor containing material cap layer protects elements of the semiconductor device structure from oxidizing when exposed to atmospheric conditions;
(c) performing a decomposition process by selectively decomposing the phosphor containing material cap layer by using high temperature desorption; and
(d) performing a regrowing process in which other layers of the GaAs based semiconductor device structure are grown;
(e) wherein said phosphor containing material cap layer comprises a layer which is from approximately 5 to 100 nm thick.

2. A method of fabricating GaAs based semiconductor device structures, comprising:
(a) performing a growing process in a reaction chamber by growing elements of a semiconductor device structure with a first type of doping over a semiconductor substrate having the first type of doping and ending with growing a final GaAs based layer of the device;
(b) performing a capping process by depositing a phosphor containing material cap layer over the final GaAs based layer formed during the growing process, wherein said phosphor containing material cap layer protects elements of the semiconductor device structure from oxidizing when exposed to atmospheric conditions;
(c) performing a decomposition process by selectively decomposing the phosphor containing material cap layer by using high temperature desorption; and
(d) performing a regrowing process in which other layers of the GaAs based semiconductor device structure are grown;
(e) wherein said high temperature desorption of said phosphor containing material cap layer is performed under a flow of Tertiarybutylarsine (TBAs) or $AsH_3$.

3. The method of claim 2, wherein desorption of said phosphor containing material cap layer occurs in response to a lack of group V phosphors in the reaction chamber, causing instability in said phosphor containing material cap layer which leads to decomposition and evaporation.

4. A method of fabricating GaAs based semiconductor device structures, comprising:
(a) performing a growing process in a reaction chamber by growing elements of a semiconductor device structure with a first type of doping over a semiconductor substrate having the first type of doping and ending with growing a final GaAs based layer of the device;
(b) performing a capping process by depositing a phosphor containing material cap layer over the final GaAs based layer formed during the growing process, wherein said phosphor containing material cap layer protects elements of the semiconductor device structure from oxidizing when exposed to atmospheric conditions;
(c) performing a decomposition process by selectively decomposing the phosphor containing material cap layer by using high temperature desorption; and
(d) performing a regrowing process in which other layers of the GaAs based semiconductor device structure are grown;
(e) wherein said semiconductor substrate, upon which are the growing elements of a semiconductor device structure, is removed from the reaction chamber between the capping process and the decomposition process.

5. A method of fabricating GaAs based semiconductor device structures, comprising:
(a) performing a growing process in a reaction chamber by growing elements of a semiconductor device structure with a first type of doping over a semiconductor substrate having the first type of doping and ending with growing a final GaAs based layer of the device;
(b) performing a capping process by depositing a phosphor containing material cap layer over the final GaAs based layer formed during the growing process, wherein said phosphor containing material cap layer protects elements of the semiconductor device structure from oxidizing when exposed to atmospheric conditions;
(c) performing a decomposition process by selectively decomposing the phosphor containing material cap layer by using high temperature desorption; and
(d) performing a regrowing process in which other layers of the GaAs based semiconductor device structure are grown;
(e) wherein said capping process, decomposition process and regrowth process can be repeated multiple times on said semiconductor substrate during semiconductor device fabrication.

6. The method of claim 1, 2, 4, or 5, further comprising forming a contact layer over the final GaAs based layer after the decomposition process and prior to fabricating additional layers of the semiconductor device structure.

7. The method of claim 1, 2, 4, or 5, wherein said semiconductor substrate is contained on a semiconductor wafer upon which semiconductor devices are being fabricated.

8. The method of claim 1, 2, 4, or 5, wherein growing of elements of the semiconductor device structures are performed by either molecular beam epitaxy (MBE) or metalorganic chemical vapor deposition (MOCVD).

9. The method of claim 1, 2, 4, or 5, wherein said phosphor containing material cap layer comprises a layer selected from a group of phosphor containing materials consisting of: binary GaP, Ternary InGaP, AlGaP, InAlP, AlAsP and quaternary InGaAsP, InAlAsP.

10. The method of claim 1, 2, 4, or 5, wherein said high temperature desorption of said phosphor containing material cap layer is performed at a temperature of from approximately 500 to 900 degrees Celsius.

11. The method of claim 1, 2, 4, or 5, wherein said semiconductor layers beneath said phosphor containing material cap layer remain stable and are not decomposed.

12. A method of fabricating semiconductor optoelectronic device structures, comprising:
(a) performing a growing process in a reaction chamber by growing a distributed Bragg reflector (DBR) stack with a first type of doping over a semiconductor substrate also having the first type of doping, and ending with growing a final GaAs based layer;
(b) performing a capping process by depositing a phosphor containing material cap layer over the distributed Bragg reflector (DBR), wherein said phosphor containing material cap layer protects the DBR from forming oxide while exposed to atmospheric conditions;
(c) performing a decomposition process by selectively decomposing the phosphor containing material cap layer by using high temperature desorption; and
(d) performing a regrowing process in which other layers of a semiconductor optoelectronic device are fabricated,
(e) wherein said phosphor containing material cap layer comprises a layer which is from approximately 5 to 100 nm thick.

13. A method of fabricating semiconductor optoelectronic device structures, comprising:
(a) performing a growing process in a reaction chamber by growing a distributed Bragg reflector (DBR) stack with a first type of doping over a semiconductor substrate also having the first type of doping, and ending with growing a final GaAs based layer;
(b) performing a capping process by depositing a phosphor containing material cap layer over the distributed Bragg reflector (DBR), wherein said phosphor containing material cap layer protects the DBR from forming oxide while exposed to atmospheric conditions;
(c) performing a decomposition process by selectively decomposing the phosphor containing material cap layer by using high temperature desorption; and
(d) performing a regrowing process in which other layers of a semiconductor optoelectronic device are fabricated;
(e) wherein said high temperature desorption of said phosphor containing material cap layer is performed under a flow of Tertiarybutylarsine (TBAs) or $AsH_3$.

14. The method of claim 13, wherein desorption of said phosphor containing material cap layer occurs in response to a lack of group V phosphors in the reaction chamber, causing instability in said phosphor containing material cap layer which leads to decomposition and evaporation.

15. The method of claim 12 or 13, further comprising forming a contact layer over the final GaAs based layer after the decomposition process and prior to fabricating additional layers of the semiconductor device structure.

16. The method of claim 12 or 13, wherein said semiconductor substrate is contained on a semiconductor wafer upon which semiconductor optoelectronic devices are being fabricated.

17. The method of claim 12 or 13, wherein the growing of elements of the semiconductor optoelectronic device structures are performed by either molecular beam epitaxy (MBE) or metal-organic chemical vapor deposition (MOCVD).

18. The method of claim 12 or 13, wherein said phosphor containing material cap layer comprises a layer selected from a group of phosphor containing materials consisting of: binary GaP, Ternary InGaP, AIGaP, InAIP, AlAsP and quaternary InGaAsP, InAlAsP.

19. The method of claim 12 or 13, wherein said high temperature desorption of said phosphor containing material cap layer is performed at a temperature of from approximately 500 to 900 degrees Celsius.

20. The method of claim 12 or 13, wherein semiconductor layers beneath said phosphor containing material cap layer remain stable and are not decomposed.

21. The method of claim 12 or 13, wherein said semiconductor substrate, upon which are the growing elements of a semiconductor device structure, is removed from the reaction chamber between the capping process and the decomposition process.

22. A method of fabricating a vertical cavity surface emitting laser (VCSEL), comprising:
(a) performing a growing process in a reaction chamber by growing a distributed Bragg reflector (DBR) stack with a first type of doping over a semiconductor substrate also having the first type of doping, and ending with growing a final GaAs layer;
(b) performing a capping process by depositing a phosphor containing material cap layer over the distributed Bragg reflector (DBR), wherein said phosphor containing material cap layer protects the DBR from forming oxides while exposed to atmospheric conditions;
(c) performing a decomposition process by selectively decomposing the phosphor containing material cap layer by using high temperature desorption; and
(d) performing a regrowing process in which other layers of a vertical cavity surface emitting laser (VCSEL) are fabricated, comprising:
(i) growing a first contact layer with the same type of doping as the DBR;
(ii) growing an undoped active region as gain material;
(iii) growing a second contact layer on the active region with different doping from the first contact layer; and
(iv) growing layers of an upper reflector.

23. The method recited in claim 22, wherein said upper reflector comprises either a distributed Bragg reflector (DBR) or a high-contrast grating (HCG).

24. The method of claim 22, wherein said semiconductor substrate is part of a semiconductor wafer upon which vertical cavity surface emitting laser (VCSEL) devices are being fabricated.

25. The method of claim 22, wherein the growing of elements of the vertical cavity surface emitting laser (VCSEL) device structure is performed by either molecular beam epitaxy (MBE) or metal-organic chemical vapor deposition (MOCVD).

26. The method of claim 22, wherein said phosphor containing material cap layer comprises a layer selected from a group of phosphor containing materials consisting of: binary GaP, Ternary InGaP, AIGaP, InAIP, AlAsP and quaternary InGaAsP, InAlAsP.

27. The method of claim 22, wherein said phosphor containing material cap layer comprises a layer which is from approximately 5 to 100 nm thick.

28. The method of claim 22, wherein said high temperature desorption of said phosphor containing material cap layer is performed at a temperature of from approximately 500 to 900 degrees Celsius.

29. The method of claim 22, wherein said high temperature desorption of said phosphor containing material cap layer is performed under a flow of Tertiarybutylarsine (TBAs) or $AsH_3$.

30. The method of claim 29, wherein desorption of said phosphor containing material cap layer occurs in response to a lack of group V phosphors in the reaction chamber, causing instability in said phosphor containing material cap layer which leads to decomposition and evaporation.

31. The method of claim 22, wherein semiconductor layers beneath said phosphor containing material cap layer remain stable and are not decomposed.

32. The method of claim 22, wherein said semiconductor substrate, upon which are the growing elements of a semiconductor device structure, is removed from the reaction chamber between the capping process and the decomposition process.

* * * * *